US008711577B2

(12) United States Patent
Zhu et al.

(10) Patent No.: US 8,711,577 B2
(45) Date of Patent: Apr. 29, 2014

(54) CONNECTOR WITH SHIELDING DEVICE AND METHOD FOR MANUFACTURING CONNECTOR

(75) Inventors: Zhi-Ming Zhu, Wuhan (CN); Ting Wang, Wuhan (CN)

(73) Assignees: Hong Fu Jin Precision Industry (WuHan) Co., Ltd., Wuhan (CN); Hon Hai Precision Industry Co., Ltd., New Taipei (TW)

( * ) Notice: Subject to any disclaimer, the term of this patent is extended or adjusted under 35 U.S.C. 154(b) by 10 days.

(21) Appl. No.: 13/615,899

(22) Filed: Sep. 14, 2012

(65) Prior Publication Data

US 2013/0164981 A1 Jun. 27, 2013

(30) Foreign Application Priority Data

Dec. 27, 2011 (CN) .......................... 2011 1 0444427

(51) Int. Cl.
*H05K 9/00* (2006.01)

(52) U.S. Cl.
USPC .......................................................... 361/818

(58) Field of Classification Search
USPC ................ 439/607.35, 213, 210, 212, 18–22, 439/607.46; 361/818
See application file for complete search history.

(56) References Cited

U.S. PATENT DOCUMENTS

| | | | | |
|---|---|---|---|---|
| 4,641,224 | A * | 2/1987 | Reimer | 361/818 |
| 6,344,978 | B1 * | 2/2002 | Komiya | 361/816 |
| 7,950,957 | B1 * | 5/2011 | Yang | 439/578 |
| 8,172,612 | B2 * | 5/2012 | Bence et al. | 439/578 |
| 8,206,176 | B2 * | 6/2012 | Islam | 439/578 |
| 8,365,404 | B2 * | 2/2013 | Van Swearingen | 29/863 |
| 2011/0201232 | A1 * | 8/2011 | Islam | 439/583 |
| 2012/0064767 | A1 * | 3/2012 | Islam et al. | 439/583 |
| 2012/0129390 | A1 * | 5/2012 | Van Swearingen et al. | 439/578 |
| 2012/0184135 | A1 * | 7/2012 | Paynter et al. | 439/584 |
| 2013/0157494 | A1 * | 6/2013 | Lim | 439/320 |
| 2013/0171878 | A1 * | 7/2013 | Zhu et al. | 439/620.21 |

* cited by examiner

*Primary Examiner* — Neil Abrams
*Assistant Examiner* — Phuong T Nguyen
(74) *Attorney, Agent, or Firm* — Novak Druce Connolly Bove + Quigg LLP

(57) ABSTRACT

A connector includes a main body and a shielding device. The main body includes a circuit board and a plurality of cables connected to the circuit board. Each of the plurality of cables includes a plastic jacket, a center core and a dielectric insulator enclosing the center core. The dielectric insulator is received in the plastic jacket, and the center core is attached to the circuit board. The shielding device includes a first insulating member, a copper foil, and a second insulating member. The circuit board is enclosed by the first insulating member and the plurality of cables extend out of the first insulating member. The copper foil covers the first insulating member and secured to the dielectric insulator, and the second insulating member encloses the copper foil. The present disclosure further offers a method for manufacturing the connector.

16 Claims, 3 Drawing Sheets

CONNECTOR WITH SHIELDING DEVICE AND METHOD FOR MANUFACTURING CONNECTOR

BACKGROUND

1. Technical Field

The present disclosure relates to electronic components, particularly to a connector with a shielding device and a method for manufacturing the connector.

2. Description of Related Art

Connectors are used to connect a first component to a second component. Generally, the connector includes a contact, a terminal, an interface, and other conductors. However electromagnetic interference and electrostatic discharge often exist between the terminal and the interface of the connector. Therefore, there is room for improvement within the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
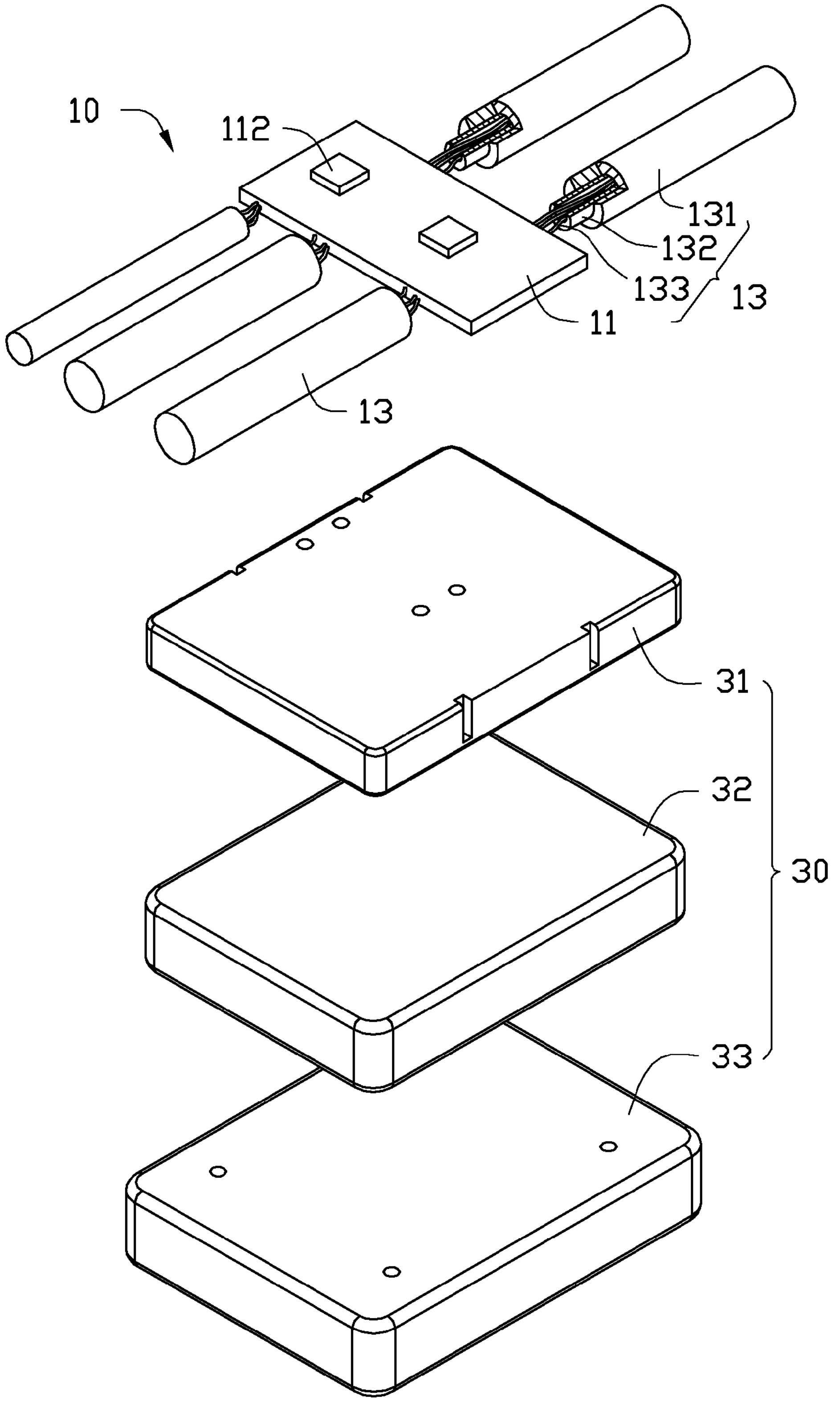
FIG. 1 is an exploded, isometric view of a connector in accordance with an embodiment.

FIG. 1 illustrates a connecter in accordance with an embodiment. The connector comprises a main body 10 and a shielding device 30 attached to the main body 10. The shielding device 30 is used to prevent the main body 10 from electromagnetic interference and electrostatic discharge.

The main body 10 includes a circuit board 11 and a plurality of cables 13 connected to the circuit board 11. A plurality of electronic components 112 (only two shown in FIG. 1) are attached to the circuit board 11. Each of the plurality of cables 13 comprises a plastic jacket 131, a plurality of center cores 133, and a plurality of dielectric insulators 132 enclosing the plurality of center cores 133. The plurality of dielectric insulators 132 are received in the plastic jacket 131, and the plurality of center cores 133 are attached to the circuit board 11. In one embodiment, the plurality of center cores 133 are secured to the circuit board 11 by soldering.

The shielding device 30 comprises a first insulating member 31, a copper foil 32, and a second insulating member 33. The first insulating member 31 is secured to the circuit board 11 and covers the circuit board 11. In one embodiment, the first insulating member 31 is polyethylene and is secured to the circuit board 11 by injection molding. The copper coil 32 is secured to the dielectric insulators 132 and located between the first insulating member 31 and the second insulating member 33. In one embodiment, the copper coil 32 is secured to the dielectric insulators 132 by soldering. The second insulating member 33 encloses the copper coil 32 to insulate the circuit board 11. In one embodiment, after the first insulating member 31 and the circuit board 11 are secured together, the second insulating member 33 is secured to the first insulating member 31 by injection molding. The second insulating member 33 is thermoplastic rubber. In one embodiment, a cross-section of the first insulating member 31 is substantially a rectangle, and the second insulating member 33 is substantially a rectangle.

Figure 2:
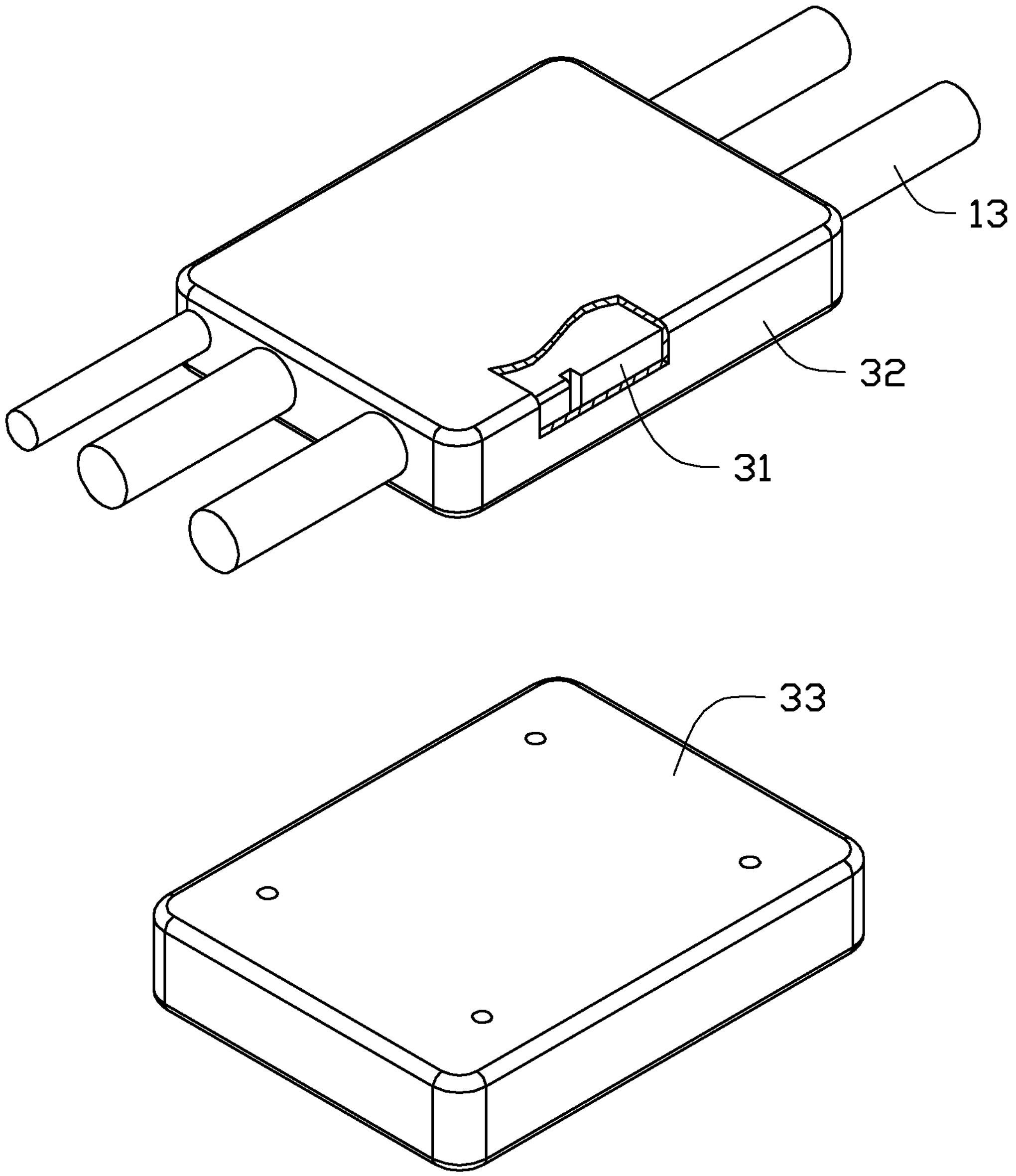
FIG. 2 is similar to FIG. 1, and a first insulating member and a copper foil are secured to a main body of the connector of FIG. 1.
Figure 3:
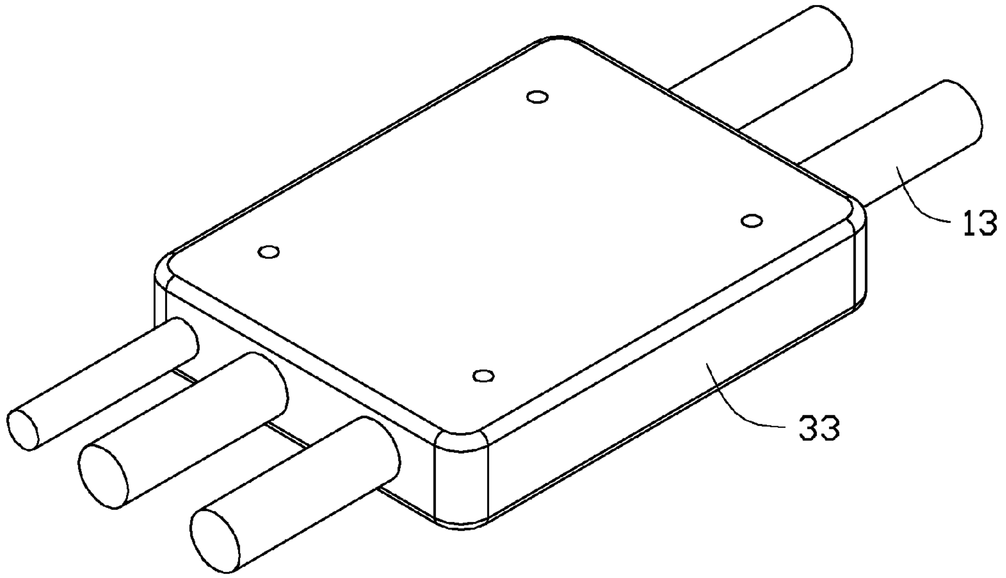
FIG. 3 is an assembled view of FIG. 1.

FIGS. 2-3 illustrate an assembled view of the connecter in accordance with an embodiment. In assembly, the plurality of center cores 133 is secured to the circuit board 11. The circuit board 11 with the plurality of center cores 133 is placed in a first mold (not shown), and a polyethylene material is fed into the first mold to form the first insulating member 31. Thus, the first insulating member 31 can cover the circuit board 11. The copper foil 32 encloses the first insulating member 31 and secured to the plurality of dielectric insulators 132 by soldering. The main body 10 with the first insulating member 31 and the copper foil 32 is placed in a second mold (not shown), and a thermoplastic rubber material is fed into the second mold to form the second insulating member 33.

In use, the circuit board 11 is covered by the copper foil 32, so that the circuit board 11 can be protected from disturbing by false signals from the outside of the circuit board or the inside of the circuit board 11. The copper foil 32 is connected to the plurality of dielectric insulators 132, so that the copper foil 32 can be for ground. Therefore, the false signal from the outside of the circuit board or the inside of the circuit board 11 can be transferred to the ground.

In addition, the first insulating member 31 and the second insulating member 33 are made by injection molding. The main body 10 is protected by the first insulating member 31 and the second insulating member 33, so that each of the plurality of electronic components 112, the solder joint between each of the plurality of center cores 133, and the circuit board 11 and the solder joint between the copper foil 32 and the plurality of dielectric insulators can be protected well. The first insulating member 31 is substantially a rectangle, and the copper foil 32 can be easily covered on the first insulating member 31.

It is to be understood, however, that even though numerous characteristics and advantages have been set forth in the foregoing description of embodiments, together with details of the structures and functions of the embodiments, the disclosure is illustrative only and changes may be made in detail, especially in matters of shape, size, and arrangement of parts within the principles of the disclosure to the full extent indicated by the broad general meaning of the terms in which the appended claims are expressed.

What is claimed is:

1. A connector comprising:

a main body comprising a circuit board and a plurality of cables connected to the circuit board; each of the plurality of cables comprising a plastic jacket, a center core, and a dielectric insulator enclosing the center core; the dielectric insulator is received in the plastic jacket, and the center core is attached to the circuit board;

a shielding device comprising a first insulating member, a copper foil, and a second insulating member; the circuit board is enclosed by the first insulating member, the plurality of cables extend out of the first insulating member, the copper foil encloses the first insulating member and is connected to the dielectric insulator, and the second insulating member encloses the copper foil.

2. The connector of claim 1, wherein the copper foil is attached to an outer surface of the first insulating member.

3. The connector of claim 1, wherein a cross-section of the first insulating member is substantially a rectangle.

4. The connector of claim 1, wherein a cross-section of the second insulating member is substantially a rectangle.

5. The connector of claim 1, wherein the first insulating member and the circuit board is secured together by injection molding.

6. The connector of claim 5, wherein the first insulating member is polyethylene.

7. The connector of claim 5, wherein the second insulating member and the first insulating member are secured together by injection molding.

8. The connector of claim 7, wherein the second insulating member is thermoplastic rubber.

9. A manufacturing method of a connector comprising:

attaching a center core to a circuit board;

enclosing the center core by a dielectric insulator and placing the dielectric insulator in a plastic jacket;

securing a first insulating member to the center core and enclosing the circuit board by the first insulating member;

enclosing the first insulating member by a copper foil and securing the copper foil to the dielectric insulator; and enclosing the copper foil by a second insulating member.

10. The method of claim 9, wherein the copper foil is attached to an outer surface of the first insulating member.

11. The method of claim 9, wherein a cross-section of the first insulating member is substantially a rectangle.

12. The method of claim 9, wherein a cross-section of the second insulating member is substantially a rectangle.

13. The method of claim 9, further comprising forming the first insulating member by injection molding.

14. The method of claim 13, wherein the first insulating member is polyethylene.

15. The method of claim 13, further comprising forming the second insulating member by injection molding.

16. The method of claim 15, wherein the second insulating member is thermoplastic rubber.

* * * * *